(12) United States Patent
Ow et al.

(10) Patent No.: US 11,913,107 B2
(45) Date of Patent: Feb. 27, 2024

(54) METHODS AND APPARATUS FOR PROCESSING A SUBSTRATE

(71) Applicant: APPLIED MATERIALS, INC., Santa Clara, CA (US)

(72) Inventors: Yueh Sheng Ow, Singapore (SG); Yuichi Wada, Chiba (JP); Junqi Wei, Singapore (SG); Kang Zhang, Singapore (SG); Kelvin Boh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 898 days.

(21) Appl. No.: 16/677,891

(22) Filed: Nov. 8, 2019

(65) Prior Publication Data

US 2021/0140029 A1     May 13, 2021

(51) Int. Cl.
| | |
|---|---|
| *C23C 14/16* | (2006.01) |
| *C23C 14/02* | (2006.01) |
| *H01L 23/00* | (2006.01) |
| *H01J 37/32* | (2006.01) |
| *H01J 37/34* | (2006.01) |

(52) U.S. Cl.
CPC .......... *C23C 14/021* (2013.01); *C23C 14/16* (2013.01); *H01J 37/32082* (2013.01); *H01J 37/3426* (2013.01); *H01L 24/03* (2013.01); *H01J 2237/332* (2013.01); *H01J 2237/334* (2013.01); *H01J 2237/335* (2013.01); *H01L 2224/0381* (2013.01); *H01L 2224/03826* (2013.01)

(58) Field of Classification Search
CPC .......... H01J 2237/332; H01J 2237/334; H01J 2237/335; H01J 37/32082; H01J 37/3426; C23C 14/021; C23C 14/022; C23C 14/16; C23C 14/165; H01L 2224/0381; H01L 2224/03826; H01L 24/03
USPC ............... 204/192.1–192.38, 298.01–298.41
See application file for complete search history.

(56) References Cited

U.S. PATENT DOCUMENTS

| | | | |
|---|---|---|---|
| 5,391,519 A | * | 2/1995 | Lur ............... H01L 21/32051 438/653 |
| 5,614,055 A | | 3/1997 | Fairbairn et al. |
| 5,983,906 A | | 11/1999 | Zhao et al. |

(Continued)

FOREIGN PATENT DOCUMENTS

| | | |
|---|---|---|
| KR | 10-2009-0052331 A | 5/2009 |
| KR | 10-2019-0059368 A | 5/2019 |
| WO | WO 2018-195417 A1 | 10/2018 |

OTHER PUBLICATIONS

International Search Report for PCT/US2020/056267, dated Feb. 15, 2021.

*Primary Examiner* — Rodney G Mcdonald
(74) *Attorney, Agent, or Firm* — Moser Taboa (57) ABSTRACT

Methods and apparatus for processing a substrate are provided herein. For example, a method for processing a substrate can includes selectively etching from a substrate disposed in the PVD chamber an exposed first layer of material, covering an underlying second layer of material, and adjacent to an exposed third layer of material, using both process gas ions and metal ions formed from a target of the PVD chamber, in an amount sufficient to expose the second layer of material while simultaneously depositing a layer of metal onto the third layer of material; and subsequently depositing metal from the target onto the second layer of material.

20 Claims, 3 Drawing Sheets

(56) References Cited

U.S. PATENT DOCUMENTS

| | | | |
|---|---|---|---|
| 6,277,249 B1 * | 8/2001 | Gopalraja | H01L 21/76865 |
| | | | 204/298.18 |
| 6,566,269 B1 * | 5/2003 | Biles | H01L 21/31122 |
| | | | 257/E21.252 |
| 7,427,568 B2 | 9/2008 | Chen et al. | |
| 9,548,228 B2 | 1/2017 | Chandrashekar et al. | |
| 9,978,610 B2 | 5/2018 | Fung et al. | |
| 10,256,142 B2 | 4/2019 | Chandrashekar et al. | |
| 2006/0223322 A1 | 10/2006 | Chen et al. | |
| 2007/0048992 A1 | 3/2007 | Hosokawa et al. | |
| 2007/0228002 A1 | 10/2007 | Geng et al. | |
| 2011/0168966 A1 | 7/2011 | Lam et al. | |
| 2018/0130707 A1 * | 5/2018 | Clendenning | H01L 21/76865 |
| 2018/0151337 A1 * | 5/2018 | Nguyen | H01J 37/3441 |

* cited by examiner

METHODS AND APPARATUS FOR PROCESSING A SUBSTRATE

FIELD

Embodiments of the present disclosure generally relate to methods and apparatus for processing a substrate, and more particularly, to methods and apparatus using a physical vapor deposition (PVD) chamber configured to perform both PVD and a preclean process on a substrate.

BACKGROUND

Process chambers configured to perform a preclean process are known. For example, in under bump metallization (UBM), such chambers are configured to remove native oxide and other materials on metal contact pads of a substrate prior to PVD for depositing one or more barrier layers, e.g., titanium (Ti), copper (Cu), tungsten (W), etc., on the substrate. Preclean chambers, typically, use ion bombardment (induced by RF plasma) to remove the native oxide on the metal contact pads. For example, the preclean process can etch the native oxide off the metal contact pads. The preclean process is configured to lower contact resistance between the metal contacts on the substrate to enhance performance and power consumption of integrated circuits (ICs) on the substrate.

After a substrate is precleaned, the substrate is moved from the preclean chamber to one or more other process chambers for further processing. For example, as noted above, the substrate can be moved from the preclean chamber to a PVD chamber so that one or more additional barrier layers can be formed on the substrate. Unfortunately, however, when the substrate is being moved from the preclean chamber to the PVD chamber, atmospheric exposure to the substrate can cause additional native oxide to develop on the metal contacts, which, in turn, can negatively affect the performance and power consumption of integrated circuits (ICs) on the substrate.

Accordingly, the inventors have provided methods and apparatus that use a PVD chamber configured to perform both PVD and a preclean process on a substrate.

SUMMARY

Methods and apparatus for processing a substrate are provided herein. In some embodiments, for example, a method for processing a substrate in a physical vapor deposition (PVD) chamber includes selectively etching from a substrate disposed in the PVD chamber an exposed first layer of material, covering an underlying second layer of material, and adjacent to an exposed third layer of material, using both process gas ions and metal ions formed from a target of the PVD chamber, in an amount sufficient to expose the second layer of material while simultaneously depositing a layer of metal onto the third layer of material; and subsequently depositing metal from the target onto the second layer of material.

In accordance with at least some embodiments, a physical vapor deposition (PVD) chamber for processing a substrate includes a DC power source and an RF power source; a target for forming metal ions to be sputtered on a surface of a substrate disposed within a processing volume of the PVD chamber; a gas source for providing at least one process gas into the processing volume of the PVD chamber; and a controller coupled to the DC power source and the RF power source and configured to selectively etch from the substrate an exposed first layer of material, covering an underlying second layer of material, and adjacent to an exposed third layer of material, using both process gas ions and metal ions, in an amount sufficient to expose the second layer of material while simultaneously depositing a layer of metal onto the third layer of material; and subsequently deposit metal from the target onto the second layer of material.

In accordance with at least some embodiments, a non-transitory computer readable storage medium having stored thereon instructions that when executed by a processor perform a method for processing a substrate in a physical vapor deposition (PVD) chamber. The method includes selectively etching from a substrate disposed in the PVD chamber an exposed first layer of material, covering an underlying second layer of material, and adjacent to an exposed third layer of material, using both process gas ions and metal ions formed from a target of the PVD chamber, in an amount sufficient to expose the second layer of material while simultaneously depositing a layer of metal onto the third layer of material; and subsequently depositing metal from the target onto the second layer of material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus that use a PVD chamber configured to perform both PVD and a preclean (or etch) process on a substrate are described herein. The PVD chamber described herein overcomes the shortcomings associated with conventional methods and apparatus used to perform PVD and preclean processes. For example, as both the PVD and preclean processes are performed in the same chamber, there is no queue time, e.g., atmospheric exposure to the substrate, from the preclean process to the PVD process, thus eliminating the likelihood of re-oxidation of metal pads of the substrate. Additionally, processing throughput of substrates will be increased, as both the PVD and preclean process are performed in the same chamber. Furthermore, polymer that can sometimes be present on the substrate (e.g., prior to a preclean process being performed on the substrate) is not inadvertently removed (polymer breakdown) as a result of an outgassing process that is usually performed on the substrate prior to the substrate being removed from the preclean chamber. More particularly, in accordance with the present disclosure, since a combination of metal ions and gas ions are used in the preclean process, any polymer that may be present on the substrate is passivated (e.g., covered) by the metal ions the during preclean process. Accordingly, the polymer is protected from polymer breakdown during an outgassing process to remove the gas ions from the PVD chamber.

Figure 1:
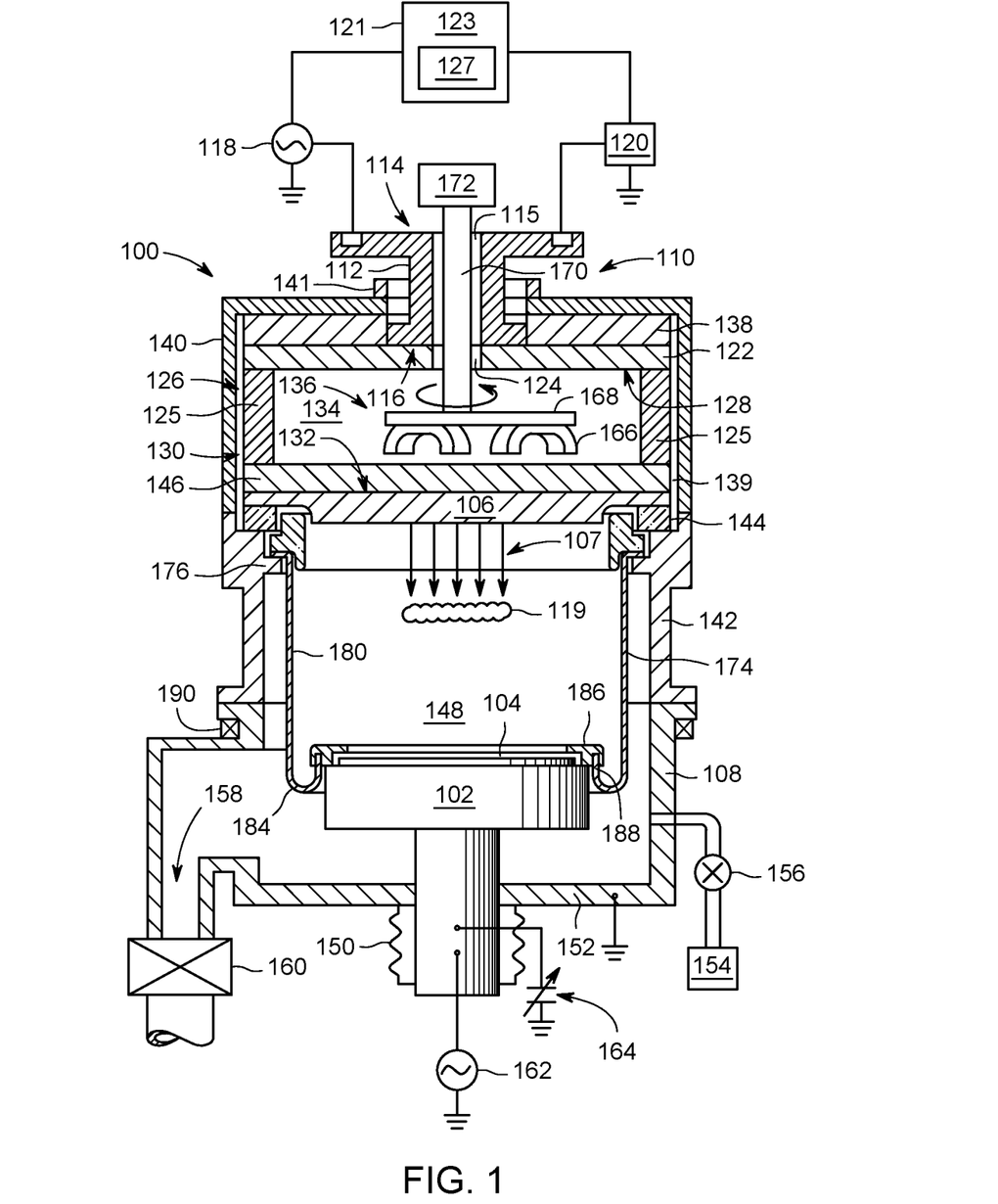
FIG. 1 is a schematic, cross-sectional view of a process chamber in accordance with at least some embodiments of the present disclosure.

FIG. 1 is a schematic, cross-sectional view of a system for processing a substrate 104 (or wafer), in accordance with at least some embodiments of the present disclosure. The system includes apparatus that can be embodied in a process chamber 100. In at least some embodiments, for example, a PVD process chamber that can be configured for use with the system can be the ALPS® Plus and SIP ENCORE® PVD line of stand-alone PVD apparatus, both commercially available from Applied Materials, Inc., of Santa Clara, California The process chamber 100 can be combined on a cluster tool, e.g., CENTURA®. For example, the cluster tool can be configured to perform ALD, CVD, epitaxy, etch, photomask fabrication, PVD, plasma doping, plasma nitridation and RTP, as well as integrated multi-step processes such as high-k transistor gate stack fabrication.

The process chamber 100 is configured to perform PVD of materials on the substrate 104 disposed in the process chamber 100. Additionally, as noted above, the process chamber 100 is configured to perform one or more additional processes. For example, the process chamber 100 can be configured to perform a preclean process for removing (e.g., etching) one or more materials from the substrate 104, as will be described in greater detail below.

Continuing with reference to FIG. 1, the process chamber 100 contains a substrate support pedestal 102 for receiving the substrate 104 thereon, and a sputtering source, such as a target 106 of source material (target 106). The substrate support pedestal 102 may be located within a grounded enclosure chamber wall 108, which may be a chamber wall (as shown) or a grounded shield. A ground shield 140 is shown covering at least some portions of the process chamber 100 above the target 106 in FIG. 1. In some embodiments, the ground shield 140 could be extended below the target to enclose the pedestal 102 as well.

The processing chamber includes a feed structure 110 for coupling RF and DC energy to the target 106. The feed structure is an apparatus for coupling RF energy and DC energy, to the target 106, or to an assembly containing the target, for example, as described herein. In some embodiments, the feed structure 110 may be tubular. The feed structure 110 includes a body 112 having a first end 114 and a second end 116 opposite the first end 114. In some embodiments, the body 112 further includes a central opening 115 disposed through the body 112 from the first end 114 to the second end 116.

The first end 114 of the feed structure 110 can be coupled to an RF power source 118 and a DC power source 120, which can be respectively utilized to provide RF and DC energy to the target 106. For example, in a first processing state, both the RF power source 118 and the DC power source 120 can be used to perform a pre-clean process on the substrate 104, and in a second processing state the DC power source 120 can be used for performing a PVD process on the substrate 104, as will be described in greater detail below. In some embodiments, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure 110 may be fabricated from suitable conductive materials to conduct the RF and DC energy from the RF power source 118 and the DC power source 120. The DC power source 120 may be alternatively coupled to the target 106 without going through the feed structure 110.

The DC power source 120 and RF power source 118 can be used simultaneously to create a first processing state (e.g., for etching the substrate 104) within a processing volume 148 of the process chamber 100. For example, the first processing state can comprise plasma 119 including both gas ions and metal ions and can be used to preclean the substrate 104 to remove one or more materials (e.g., native oxide) from the substrate 104. The DC power source can be used to create a second processing state (e.g., for performing PVD on the substrate 104). For example, the second processing state can comprise only metal atoms and/or ions and can be used to perform PVD on the substrate 104 to deposit one or more metals on the substrate 104, as will be described in greater detail below.

Additionally, an RF bias power source 162 may be coupled to the substrate support pedestal 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. In other applications, the substrate support pedestal 102 may be grounded or left electrically floating. For example, a capacitance tuner 164 may be coupled to the substrate support pedestal for adjusting voltage on the substrate 104 for applications where RF bias power may not be desired.

The feed structure 110 may have a suitable length that facilitates substantially uniform distribution of the respective RF and DC energy about the perimeter of the feed structure 110. For example, in some embodiments, the feed structure 110 may have a length of about 0.75 to about 12 inches, or about 3.26 inches.

In some embodiments, the body 112 may have a length to inner diameter ratio of at least about 1:1. In some embodiments, the body may have a length to outer diameter ratio of at least about 0.5:1, for example, about 0.6:1.

The inner diameter of the feed structure 110 (i.e., the diameter of the central opening 115) may be as small as possible, for example, from about 1 inch to about 11 inches, or about 3.9 inches, while still allowing for a magnetron shaft to extend therethrough. In some embodiments, where no magnetron shaft is present (for example, where a magnetron is not used or wherein the magnetron is controlled in a manner other than via a shaft centrally disposed above the backside of the target), the inner diameter of the feed structure 110 may be a small as zero inches (e.g., the body 112 may be provided without the central opening 115). In such embodiments, the inner diameter, if any, of the feed structure 110 may be, for example, from about 0 inches to about 11 inches.

The outer diameter of the feed structure 110 may be as small as possible, for example from about 1.5 inches to about 12 inches, or about 5.8 inches, while maintaining a sufficient wall thickness of the feed structure 110 for mechanical integrity. In some embodiments, where no magnetron shaft is present, the outer diameter 250 of the feed structure 110 may be a small as about 0.5 inches. In such embodiments, the outer diameter of the feed structure 110 may be, for example, from about 0.5 inches to about 12 inches.

Providing a smaller inner diameter (and a smaller outer diameter) facilitates improving the length to ID ratio (and the length to OD ratio) without increasing the length of the feed structure 110. Although described above as used to couple both RF and DC energy to the target 106, the feed structure 110 may also be used to couple just RF energy to the target, with DC energy coupled to the target from a different location. In such embodiments, the RF energy remains more uniformly provided to the target to facilitate more uniform plasma processing even though the DC energy may not be as uniform as if provided via the feed structure 110, for example, when performing an etch process to remove material from the substrate 104.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1 and described further below. In some embodiments, the cavity may be at least partially filled with a cooling fluid, such as water ($H_2O$) or the like.

A ground shield 140 may be provided to cover the outside surfaces of the lid of the process chamber 100. The ground shield 140 may be coupled to ground, for example, via the ground connection of the chamber body. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar 141 may be disposed about body 112 and lower portion of the feed structure 110. The ground collar 141 is coupled to the ground shield 140 and may be an integral part of the ground shield 140 or a separate part coupled to the ground shield to provide grounding of the feed structure 110. The ground collar 141 may be made from a suitable conductive material, such as aluminum or copper. In some embodiments, a gap disposed between the inner diameter of the ground collar 141 and the outer diameter of the body 112 of the feed structure 110 may be kept to a minimum and be just enough to provide electrical isolation. The gap can be filled with isolating material like plastic or ceramic or can be an air gap. The ground collar 141 prevents cross-talk between the RF feed and the body 112, thus improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure 110 to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

Returning to FIG. 1, the target 106 may be supported on a grounded conductive aluminum adapter 142 through a dielectric isolator 144. In general, the target 106 can be any material typically used in thin film fabrication via PVD, such a metal or metal oxide. For example, in some embodiments, the target 106 can be a metal, such as titanium (Ti), or the like, suitable for depositing Ti or Ti nitride (TiN), tungsten (W), copper (Cu), etc., on the substrate 104. Other materials may suitably be used as well in accordance with the teachings provided herein.

The target 106 is generally elongate and can be, for example, cylindrical or rectangular. A size of the target 106 can vary depending upon a size of the substrate 104 and/or a configuration of the process chamber 100. For example, for processing a 300 mm diameter semiconductor wafer, the target 106 can be between about 100 to about 200 mm in width or diameter, and can have a length of about 400 to about 600 mm. The target 106 can be stationary or movable, including rotatable along an elongate axis of the target 106.

In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in the processing volume 148 of the process chamber 100. The processing volume 148 is defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of the process chamber 100 and thereafter raised to a deposition, or processing position, such as a pre-clean processing position.

One or more process gases may be supplied from a gas source 154 through a mass flow controller 156 into the lower part of the process chamber 100. The process gasses can be any suitable process gas, such as an inert gas (e.g., argon) or nitrogen (N2), for forming a plasma within the processing volume 148 when sputtering material 107 from the target 106. The process gas can also be used for preforming a preclean process on the substrate 104, as will be described in greater detail below. An exhaust port 158 may be provided and coupled to a pump (not shown) via a valve 160 for exhausting or outgassing spent process gas from the interior of the processing chamber 100 and/or facilitating maintaining a desired pressure inside the process chamber 100.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the process chamber 100 and the substrate 104. A motor 172 can be coupled to the upper end of the rotation shaft 170 to drive rotation of the rotatable magnetron assembly 136. The magnets 166 produce a magnetic field within the process chamber 100, generally parallel and close to the surface of the target 106 to trap electrons and increase the local plasma density, which in turn increases the sputtering rate, e.g., during PVD. The magnets 166 produce an electromagnetic field around the top of the process chamber 100, and magnets 166 are rotated to rotate the electromagnetic field which influences the plasma density of the process to more uniformly sputter the target 106. For example, the rotation shaft 170 may make about 0 to about 150 rotations per minute.

In some embodiments, the process chamber 100 may further include a grounded bottom shield 174 connected to a ledge 176 of the adapter 142. A dark space shield 178 may be supported on the bottom shield 174 and may be fastened to the bottom shield 174 by screws or other suitable manner. The metallic threaded connection between the bottom shield 174 and the dark space shield 178 allows the bottom shield 174 and the dark space shield 178 to be grounded to the adapter 142. The adapter 142 in turn is sealed and grounded to the chamber wall 108. Both the bottom shield 174 and the dark space shield 178 are typically formed from hard, non-magnetic stainless steel.

The bottom shield 174 extends downwardly and may include a generally tubular portion 180 having a generally constant diameter. The bottom shield 174 extends along the walls of the adapter 142 and the chamber wall 108 downwardly to below a top surface of the substrate support pedestal 102 and returns upwardly until reaching a top surface of the substrate support pedestal 102 (e.g., forming a u-shaped portion 184 at the bottom). A cover ring 186 rests on the top of the upwardly extending inner portion 188 of the bottom shield 174 when the substrate support pedestal 102 is in a lower, loading position but rests on the outer periphery of the substrate support pedestal 102 when the substrate support pedestal 102 is in the an upper, deposition position to protect the substrate support pedestal 102 from sputter deposition. An additional deposition ring (not shown) may be used to shield the periphery of the substrate 104 from deposition.

In some embodiments, a magnet 190 may be disposed about the process chamber 100 for selectively providing a magnetic field between the substrate support pedestal 102 and the target 106. For example, as shown in FIG. 1, the magnet 190 may be disposed about the outside of the chamber wall 108 in a region just above the substrate support pedestal 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

A controller 121 including a processor 123 is configured (or programmed) to control the overall operation of the process chamber 100. For example, the controller 121, under control of the processor 123, can receive a recipe that is input into a memory 127 of the processor 123. For example, the memory 127 can be a nontransitory computer readable storage medium having instructions that when executed by the processor 123 (or controller 121) perform the methods described herein. The recipe can include information relating to one or more parameters associated with one or more of the aforementioned components used for processing the substrate 104. For example, the controller 121 can use the information in the recipe to control the RF power source 118 and the DC power source 120 for controlling an amount of power used during operation, for tuning the RF power source 18 and the DC power source 120, e.g., to choose either or both of the RF power source 18 and the DC power source 120 to generate inert gas ions, metal ions, and/or a combination of gas ions and metal ions, for controlling a height of the substrate support pedestal 102, such as when the substrate 104 is being loaded into the process chamber 100 or being processed, the gas source 154 for controlling an amount of process gas that is to be supplied into the process chamber 100, the plurality of magnets 166 for controlling a position of the magnets or a speed at which the plurality of magnets 166 are rotated, etc.

Figure 2:
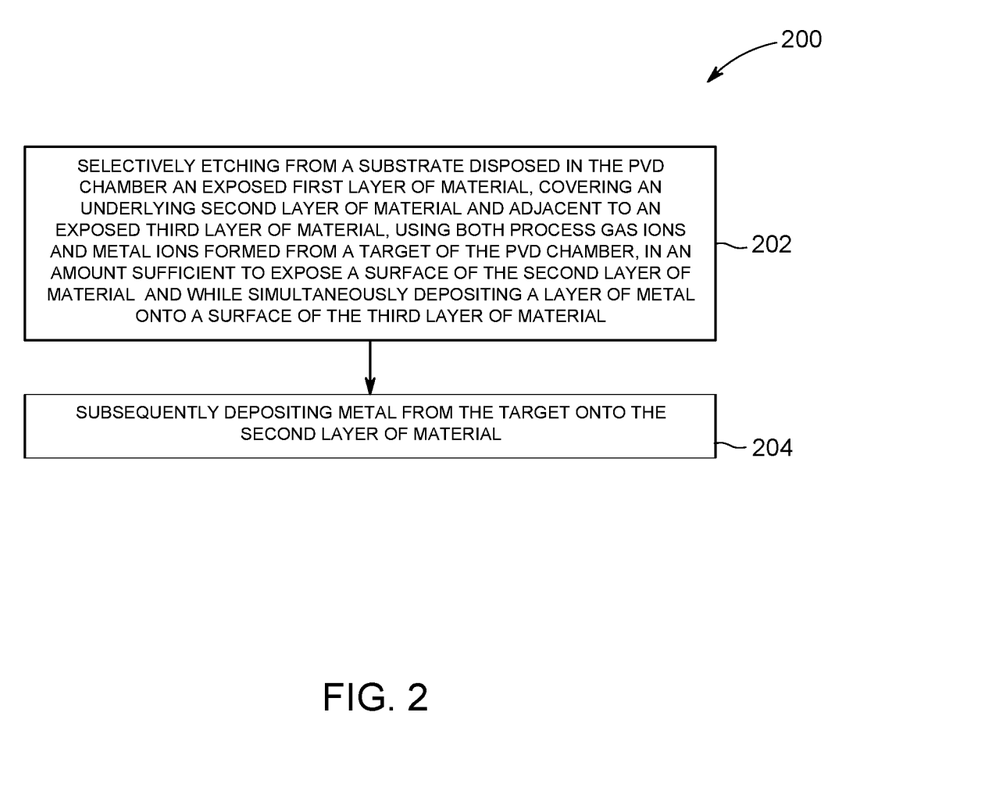
FIG. 2 is a flowchart of a method for processing a substrate in accordance with at least some embodiments of the present disclosure.
Figure 3A:
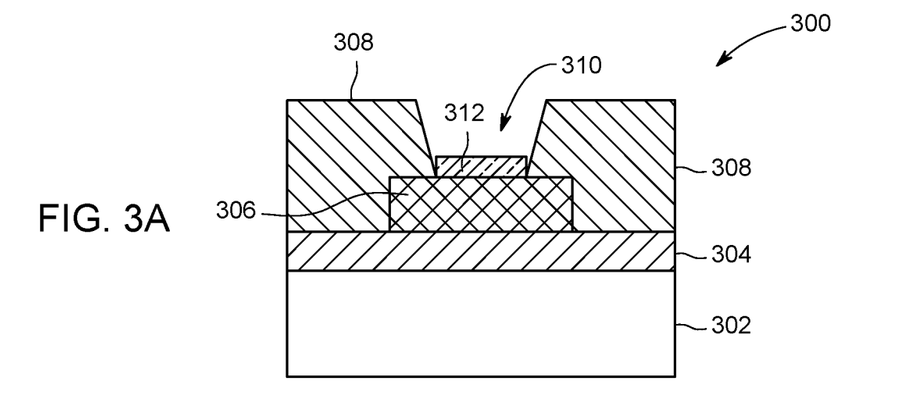
FIGS. 3A-3C are schematic diagram illustrating various stages of a substrate being processed using the method of FIG. 2 in accordance with at least some embodiments of the present disclosure.
Figure 3B:
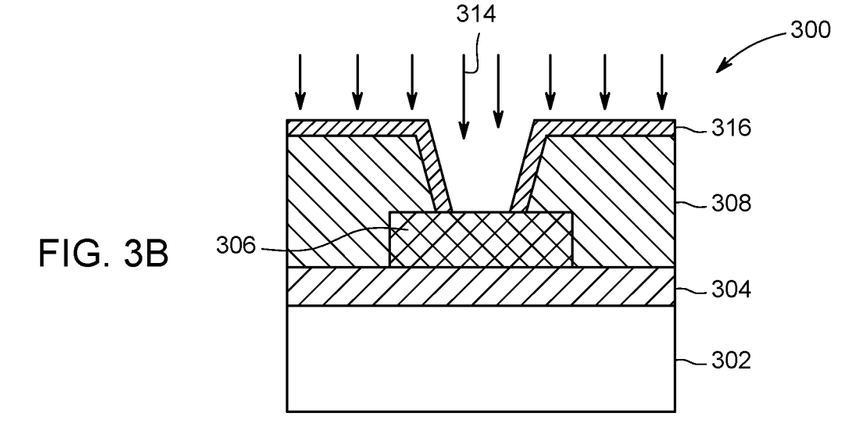
Figure 3C:
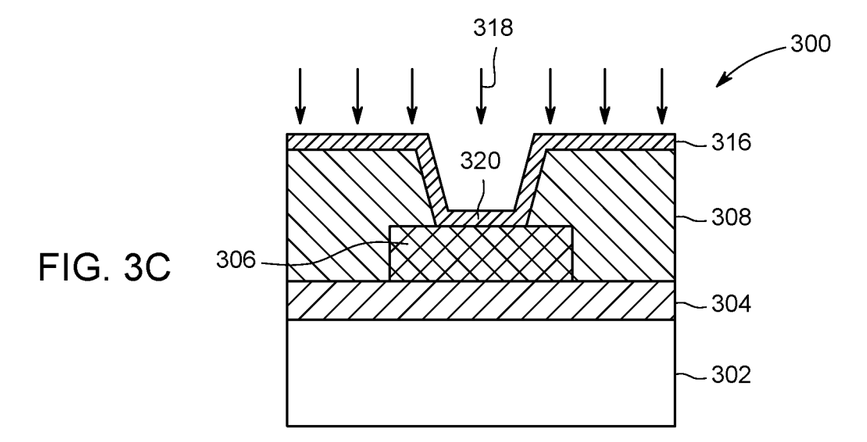

FIG. 2 is a flowchart of a method 200 for processing a substrate, and FIGS. 3A-3C are schematic diagrams illustrating various stages of a substrate being processed using the method 200 of FIG. 2, in accordance with at least some embodiments of the present disclosure.

Initially, a substrate, e.g., the substrate 104, can be formed using one or more process chambers (e.g., a CVD chamber, ALD chamber, etc.) and can be made from any suitable material for forming a substrate described herein, including, but not limited to, silicon or germanium. For example, in at least some embodiments, the substrate can be a substrate 300 having a base layer 302 that is made of silicon (FIG. 3A). Deposited atop the base layer 302 can be one or more additional layers of material including, but not limited to, an oxide, such as a thermal oxide, one or more types of metal, one or more types of polymer, etc. For example, in at least some embodiments, the base layer 302 can have a layer of thermal oxide 304 deposited thereon, a conductive layer, such as a metal layer, for example, a layer of aluminum 306 (e.g., a second layer of material) that at least partially covers the layer of thermal oxide 304, and a layer of polymer 308 (e.g., a third layer of material) that at least partially covers the layer of thermal oxide 304 and the layer of aluminum 306, thus forming a trench (or via) 310 that exposes at least part of the layer of aluminum 306 (see FIG. 3A, for example). In at least some embodiments, the thermal oxide can be silicon oxide ($SiO_2$) (or other suitable thermal oxide), and the polymer can include, but is not limited to, polyimides (PI), polybenzoxazoles (PBO), etc. In addition, the layer of thermal oxide 304 can have a thickness of about 100 Å to about 10,000 Å.

After the substrate 300 of FIG. 3A is formed, one or more additional processes may need to be performed on the substrate 300. For illustrative purposes, the additional process is assumed to be PVD for depositing one or more additional layers of metals on the substrate 300. As noted above, however, native oxide (e.g., a first layer of material, such as a layer of metal oxide) can sometimes form on the metal contact pads (e.g., the layer of aluminum 306) on the substrate as the substrate is being transported from one process chamber to another process chamber. Accordingly, for illustrative purposes, a layer of aluminum oxide 312 is shown atop of the layer of aluminum 306 (FIG. 3A).

The substrate 300 can be loaded into the process chamber in a suitable manner as described above, e.g., through a load lock, slit valve, or the like. Once loaded, in at least some embodiments, a controller (e.g., the controller 121) can select one or both of the DC power source 120 and the RF power source 118 to create one or more process states to perform one or more corresponding processes (at 202). For example, at 202, the controller can create a first process state that can be used for performing a preclean process (e.g. selectively etching) on a substrate.

For example, the inventors have found that the first process state can be created by selecting both the DC power source 120 and the RF power source 118, and depending on a target and process gas provided within inner volume of the process chamber, plasma (e.g., the plasma 119) including one or more target ions (e.g., target 106 ions) and gas ions can be created within the process chamber. The plasma including the one or more target ions and gas ions can be used at to perform a preclean process to remove (e.g., selectively etch) native oxide from the substrate (e.g., metal oxide, such as the layer of aluminum oxide 312 from the substrate 300) and/or deposit a thin film layer of target material atop one or more layers on the substrate (e.g., the layer of polymer 308).

Accordingly, in at least some embodiments, the target can include a metal (e.g., titanium, tungsten, copper, etc.) and the process gas can include an inert gas (e.g., argon, nitrogen, or other inert gas, such as one or more noble gases). Consequently, when the controller selects both the DC power source 120 and the RF power source 118, the first processing state comprising plasma including both metal ions and inert gas ions is created (depicted by arrows 314 in FIG. 3B) to perform a preclean process to remove (e.g., selectively etch) the native oxide and/or deposit a thin film layer of metal.

For example, during etching of the substrate 300, the metal ions and inert gas ions bombard the substrate 300 to remove a first layer of material, e.g., the native oxide, from a second layer of material, e.g., the layer of aluminum 306, at 202. Additionally, during etching at 202 (or after etching at 204) of the substrate 300, a thin film layer of metal 316 is also deposited atop a third layer of material, e.g., the layer of polymer 308. The thin film layer of metal 316 atop the layer of polymer 308 protects the layer of polymer 308 during a degassing or outgassing procedure used to remove spent process gas from the inner volume of the process chamber. The controller can also be configured to adjust one or more parameters (e.g., amount of power supplied from the RF power source 118 and the DC power source 120, pressure, temperature, magnet rotation, gas flow, biasing, etc.) to control a thickness of the thin layer of metal 316 deposited atop the layer of polymer 308 and/or an amount of metal ions and/or inert gas ions that are created within the inner volume of the process chamber.

Moreover, at 204 (e.g., after the etch process is completed) the controller can deposit one or more materials on the substrate. For example, the controller can select just the DC power source 120 to create a second processing state comprising only metal ions (depicted by arrows 318 in FIG. 3C) to perform PVD to deposit a layer of metal 320 atop the etched layer of aluminum 306 and/or an additional layer of metal atop the layer of polymer 308. In at least some embodiments, the metal used for performing the etch process can be the same as or different from the metal used for performing PVD. In some embodiments, one or more process gases can also be used during PVD of the substrate. Again, the controller can also be configured to adjust one or more parameters (e.g., amount of power supplied from the RF power source 118 and the DC power source 120, pressure, temperature, magnet rotation, gas flow, biasing, etc.) to control a thickness of the thin layer of metal 320 deposited atop the layer of aluminum 306 (and/or atop the layer of polymer 308) and/or an amount of metal ions that are created within the inner volume of the process chamber.

While the foregoing is directed to embodiments of the present disclosure, other and further embodiments of the disclosure may be devised without departing from the basic scope thereof.

The invention claimed is:

1. A method for processing a substrate in a physical vapor deposition (PVD) chamber, comprising:
   selectively etching from a substrate disposed in the PVD chamber an exposed first layer of material, covering an underlying second layer of material, and adjacent to a third layer of material having a top surface exposed above an entirety of the first layer of material, using both process gas ions and metal ions formed from a target of the PVD chamber, in an amount sufficient to expose the second layer of material while simultaneously depositing a layer of metal to passivate the third layer of material to protect the third layer from breakdown during an outgassing procedure; and
   subsequently depositing metal from the target onto the second layer of material.

2. The method of claim 1, wherein subsequently depositing metal from the target onto the second layer of material comprises depositing metal from the target onto the layer of material deposited on the third layer of material.

3. The method of claim 1, wherein selectively etching the first layer of material comprises using both a DC power source and an RF power source.

4. The method of claim 1, wherein depositing metal comprises using only a DC power source.

5. The method of claim 1, wherein the first layer of material is a layer of metal oxide, the second layer of material is a metal, and the third layer of material is a layer of polymer.

6. The method of claim 5, wherein the layer of metal oxide is aluminum oxide, the layer of metal is aluminum, and the layer of polymer is one of polyimides (PI) or polybenzoxazoles (PBO).

7. The method of claim 1, wherein the target is made from at least one of titanium, tungsten, or copper.

8. The method of claim 1, wherein the outgassing procedure is performed after selectively etching the substrate to remove spent process gas from the PVD chamber.

9. The method of claim 1, wherein the process gas ions are at least one of argon or nitrogen.

10. A physical vapor deposition (PVD) chamber for processing a substrate, comprising:
   a DC power source and an RF power source;
   a gas source for providing at least one process gas into a processing volume of the PVD chamber; and
   a controller coupled to the DC power source and the RF power source and configured to:
   form metal ions to be sputtered on a surface of a substrate disposed within the processing volume of the PVD chamber, selectively etch from the substrate an exposed first layer of material, covering an underlying second layer of material, and adjacent to a third layer of material having a top surface exposed above an entirety of the first layer of material, using both process gas ions and metal ions, in an amount sufficient to expose the second layer of material while simultaneously depositing a layer of metal to passivate the third layer of material to protect the third layer from breakdown during an outclassing procedure; and
   subsequently deposit metal onto the second layer of material.

11. The PVD chamber of claim 10, wherein subsequently depositing metal onto the second layer of material comprises depositing metal onto the layer of material deposited on the third layer of material.

12. The PVD chamber of claim 10, wherein the controller is further configured to selectively etch the first layer of material using both the DC power source and the RF power source.

13. The PVD chamber of claim 10, wherein the controller is further configured to deposit the metal using only the DC power source.

14. The PVD chamber of claim 10, wherein the first layer of material is a layer of metal oxide, the second layer of material is a metal, and the third layer of material is a layer of polymer.

15. The PVD chamber of claim 14, wherein the layer of metal oxide is aluminum oxide, the layer of metal is aluminum, and the layer of polymer is one of polyimides (PI) or polybenzoxazoles (PBO).

16. The PVD chamber of claim 10, wherein a target when used to form the metal ions is at least one of titanium, tungsten, or copper.

17. The PVD chamber of claim 10, wherein the process gas ions are at least one of argon or nitrogen.

18. A nontransitory computer readable storage medium having stored thereon instructions that when executed by a processor perform a method for processing a substrate in a physical vapor deposition (PVD) chamber, comprising:
   selectively etching from a substrate disposed in the PVD chamber an exposed first layer of material, covering an underlying second layer of material, and adjacent to a third layer of material having a top surface exposed above an entirety of the first layer of material, using both process gas ions and metal ions formed from a target of the PVD chamber, in an amount sufficient to expose the second layer of material while simultaneously depositing a layer of metal to passivate the third layer of material to protect the third layer from breakdown during an outgassing procedure; and
   subsequently depositing metal from the target onto the second layer of material.

19. The nontransitory computer readable storage medium of claim 18, wherein subsequently depositing metal from the target onto the second layer of material comprises depositing metal from the target onto the layer of material deposited on the third layer of material.

20. The nontransitory computer readable storage medium of claim 18, wherein selectively etching the first layer of material comprises using both a DC power source and an RF power source.

* * * * *

UNITED STATES PATENT AND TRADEMARK OFFICE
CERTIFICATE OF CORRECTION

PATENT NO. : 11,913,107 B2
APPLICATION NO. : 16/677891
DATED : February 27, 2024
INVENTOR(S) : Yueh Sheng Ow et al.

Page 1 of 1

It is certified that error appears in the above-identified patent and that said Letters Patent is hereby corrected as shown below:

In the Claims

Column 11, Line 25, Claim 10, delete "outclassing" and insert -- outgassing --

Signed and Sealed this
Seventeenth Day of December, 2024

Derrick Brent
*Acting Director of the United States Patent and Trademark Office*